United States Patent
Sirkett et al.

(10) Patent No.: US 9,598,224 B2
(45) Date of Patent: Mar. 21, 2017

(54) COMPONENT FEEDER WITH FLEXIBLE RETAINING WALLS

(75) Inventors: Daniel Sirkett, Vasteras (SE); Per Nylen, Vasteras (SE); Ivan Lundberg, Vasteras (SE)

(73) Assignee: ABB Research Ltd., Zurich (CH)

( * ) Notice: Subject to any disclaimer, the term of this patent is extended or adjusted under 35 U.S.C. 154(b) by 98 days.

(21) Appl. No.: 14/422,590

(22) PCT Filed: Aug. 22, 2012

(86) PCT No.: PCT/EP2012/066355
§ 371 (c)(1),
(2), (4) Date: Feb. 19, 2015

(87) PCT Pub. No.: WO2014/029432
PCT Pub. Date: Feb. 27, 2014

(65) Prior Publication Data
US 2015/0232255 A1 Aug. 20, 2015

(51) Int. Cl.
*B65D 90/02* (2006.01)
*B65D 83/04* (2006.01)
*B65G 65/00* (2006.01)

(52) U.S. Cl.
CPC .............. *B65D 83/04* (2013.01); *B65G 65/00* (2013.01); *B65G 2201/02* (2013.01)

(58) Field of Classification Search
CPC ..................................................... B65D 83/04
USPC ........................................ 220/666, 667, 904
See application file for complete search history.

(56) References Cited

U.S. PATENT DOCUMENTS

| 4,927,001 | A  |   | 5/1990  | Hendricks           |
|-----------|----|---|---------|---------------------|
| 5,687,831 | A  |   | 11/1997 | Carlisle            |
| 7,028,829 | B2 |   | 4/2006  | Buchi               |
| 8,967,365 | B2 | * | 3/2015  | Sirkett ........ B65G 47/19 198/396 |
| 9,365,359 | B2 | * | 6/2016  | Sirkett ........ B65G 47/1478 |
| 2011/0284344 | A1 |   | 11/2011 | Perroud et al.   |
| 2012/0067906 | A1 | * | 3/2012  | Szasz ........ B28B 7/348 220/657 |

FOREIGN PATENT DOCUMENTS

EP    1642853 A2    4/2006

OTHER PUBLICATIONS

Materials Data Book, 2003 Edition, Cambridge University Engineering Department available at http://www-mdp.eng.cam.ac.uk/web/library/enginfo/cueddatabooks/materials.pdf.*
International Search Report & Written Opinion of the International Searching Authority Application No. PCT/EP2012/066355 Completed: Jun. 12, 2013; Mailing Date: Jun. 19, 2013 8 pages.

* cited by examiner

*Primary Examiner* — Michael McCullough
*Assistant Examiner* — Mark Hageman
(74) *Attorney, Agent, or Firm* — Whitmyer IP Group LLC

(57) ABSTRACT

A component feeder includes a distributor for distributing components from a bulk storage on a pick surface, and a retaining wall preventing the components from escaping the pick surface. The retaining wall is flexible such that it deforms when a force is applied on it, and it assumes its original shape when the force is no longer applied. The flexible retaining wall allows a robot gripper to push the retaining wall aside when picking a component close to the retaining wall.

20 Claims, 4 Drawing Sheets

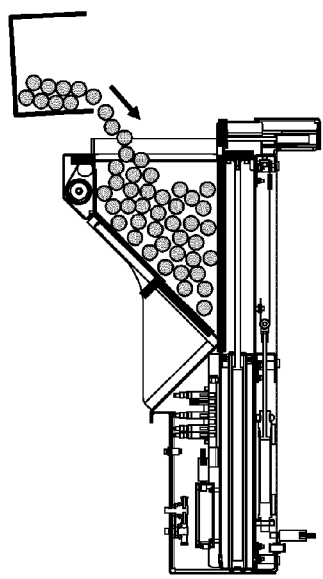 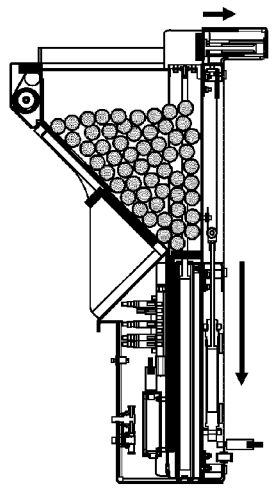 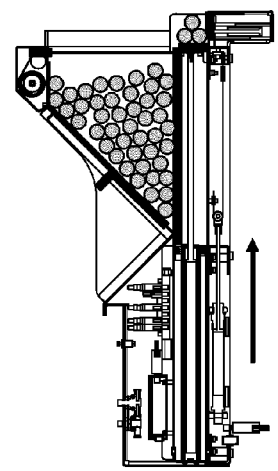
Fig.4a  Fig. 4b  Fig. 4c
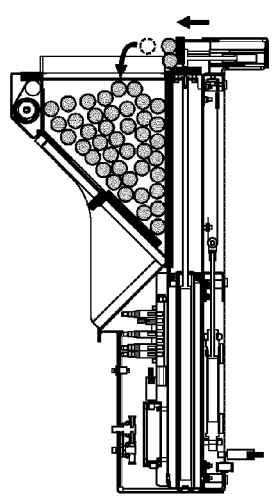 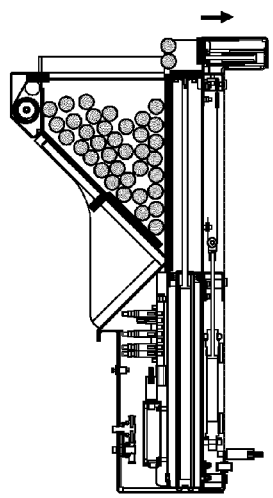 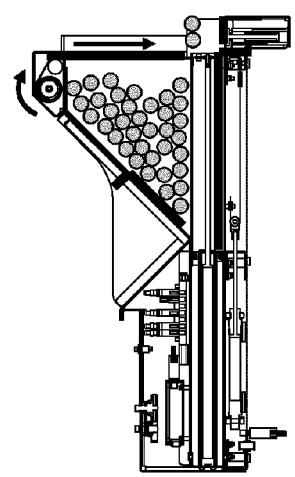
Fig. 4d  Fig. 4e  Fig. 4f

COMPONENT FEEDER WITH FLEXIBLE RETAINING WALLS

FIELD OF THE INVENTION

The present invention relates to a retaining wall preventing components from escaping a pick surface of a component feeder.

BACKGROUND OF THE INVENTION

Referring to FIG. 1a, a conventional component feeder comprises a pick surface 10 on which components 20 are distributed, and from which the components 20 are subsequently picked e.g. by means of a robot gripper 30. A pick surface 10 is typically a planar and horizontal surface which is surrounded by a retaining wall 40 for preventing the components 20 from escaping the pick surface 10. It is desirable to have a high retaining wall 40 for maximum resistance against component escape. A high retaining wall 40, however, poses a problem when components 20 near the retaining wall 40 should be picked since part of the robot gripper 30, such as a suction tool 50, may collide with the retaining wall 40 before the robot gripper fingers 60 can reach the component 20, as illustrated in FIG. 1b. The retaining wall 40 can be made lower, but this compromises its efficacy.

SUMMARY OF THE INVENTION

One object of the invention is to provide an improved component feeder wherein components can be picked close to a retaining wall without compromising the resistance against component escape.

This object is achieved by the device according to the invention.

The invention is based on the realization that a flexible retaining wall allows the robot gripper to push the retaining wall aside when picking a component close to the retaining wall.

According to a first aspect of the invention, there is provided a component feeder comprising a distributer for distributing components from a bulk storage on a pick surface, and a retaining wall preventing the components from escaping the pick surface. The retaining wall is flexible such that it deforms when a force is applied on it, and it assumes its original shape when the force is no longer applied. A flexible retaining wall does not impede robot gripper fingers access to a component lying close to the retaining wall.

According to one embodiment of the invention, the retaining wall comprises material having Young's modulus value less than 50 MPa, such as less than 20 MPa, such as less than 10 MPa, such as less than 5 MPa, such as less than 2 MPa, or such as less than 1 MPa. The flexibility of the retaining wall can be easily achieved by manufacturing the retaining wall from an appropriate material.

According to one embodiment of the invention, the retaining wall material comprises neoprene. Neoprene has been found to be a suitable retaining wall material for a certain application.

According to one embodiment of the invention, the retaining wall has in the direction of its height a stiffness less than 100 N/mm, such as less than 10 N/mm, such as less than 5 N/mm, such as less than 2 N/mm, or such as less than 1 N/mm. When the stiffness of the retaining wall has a certain relatively low value in the direction of its height, a robot gripper approaching from above can easily deform the retaining wall in this direction.

According to one embodiment of the invention, the retaining wall has a height of at least five times the thickness, such as at least ten times the thickness, such as at least twenty times the thickness, or such as at least thirty times the thickness. A relatively high and thin retaining wall is easily deformable. A higher retaining wall provides a better resistance against component escape, and a thinner retaining wall provides a smaller footprint around the pick surface.

According to one embodiment of the invention, the retaining wall is vertical. A vertical retaining wall renders the footprint of the same around the pick surface as small as possible.

BRIEF DESCRIPTION OF THE DRAWINGS

The invention will be explained in greater detail with reference to the accompanying drawings, wherein:

FIGS. 4A-I illustrate a work cycle of a component feeder according to one embodiment of the invention.

DETAILED DESCRIPTION OF THE INVENTION

Figure 1A:
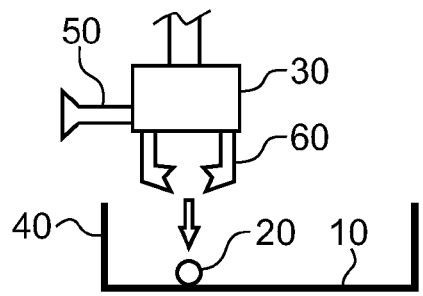
FIGS. 1A-B illustrate a problem with a component feeder having conventional retaining walls.
Figure 1B:
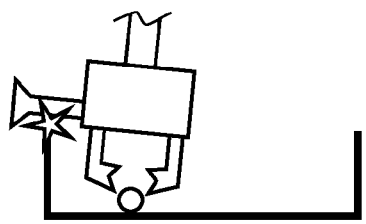
Figure 2A:
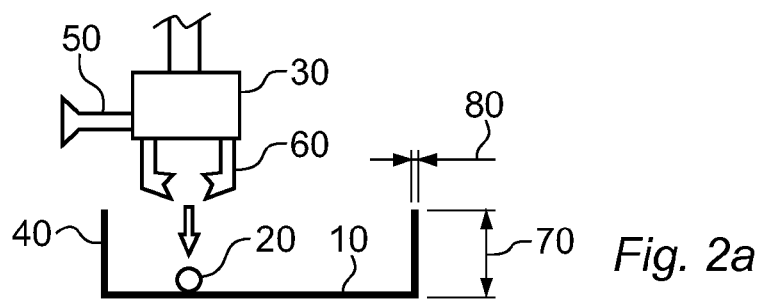
FIGS. 2A-C illustrate an advantage achieved with flexible retaining walls.
Figure 2B:
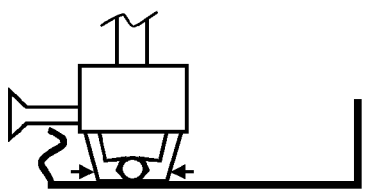
Figure 2C:
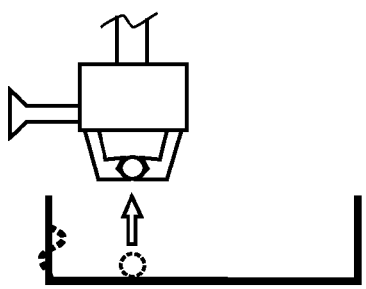

Referring to FIG. 2, a pick surface 10 surrounded by a flexible retaining wall 40 is shown. The suction tool 50 of the robot gripper 30 collides with the retaining wall 40 causing the same to deform. Consequently, the retaining wall 40 does not impede the robot gripper fingers 60 access to the component 20. Once the component 20 has been picked, the retaining wall 40 assumes its original shape. The height 70 of the retaining wall is five to thirty times the thickness 80 of the same.

Figure 3:
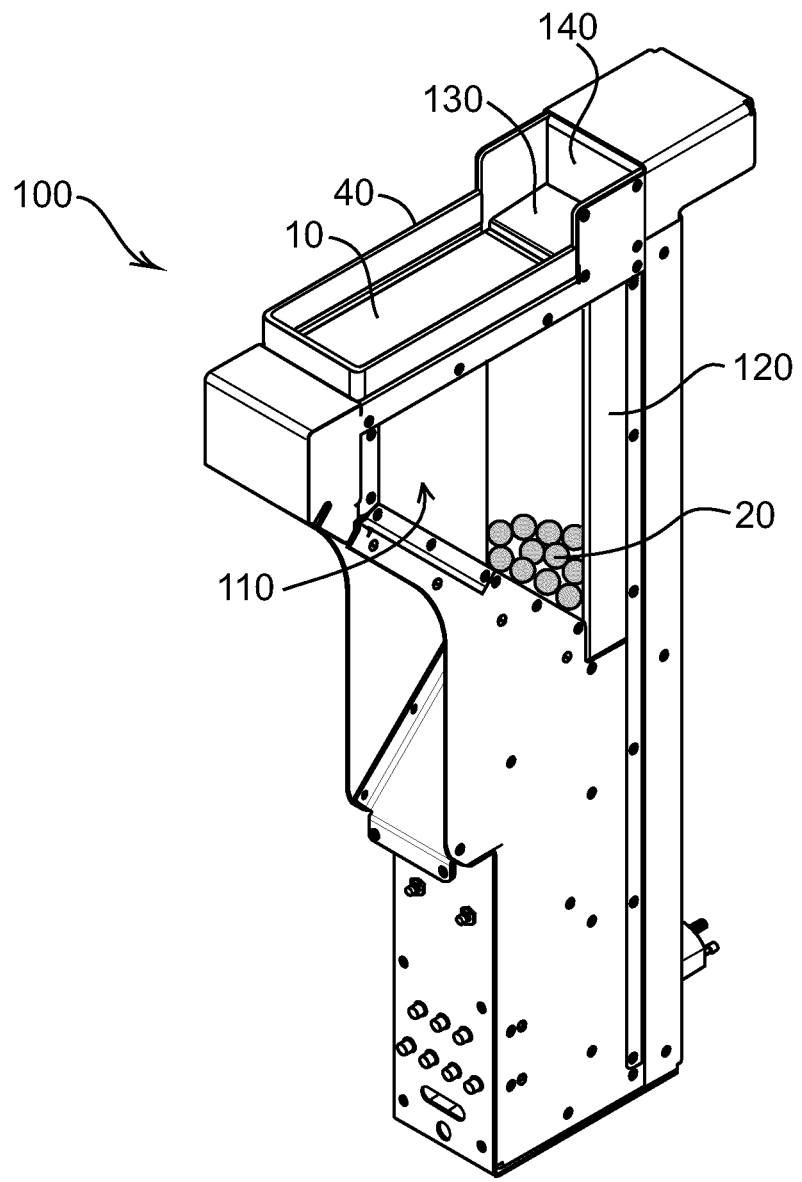
FIG. 3 shows a component feeder according to one embodiment of the invention.

Referring to FIG. 3, one embodiment of a component feeder 100 according to the invention comprises a triangular hopper 110 for receiving a bulk storage of components 20 to be fed. At the rear of the hopper 110 there is provided a vertically acting lift 120 with a horizontal lift platform 130 for lifting the components 20. In the upper rear corner of the component feeder 100 there is provided a horizontally acting spreader in the form of a pusher plate 140. A retractable pick surface 10 covers the bulk storage completely in its unfurled state shown in FIG. 3. The lift 120 and the pusher plate 140 together constitute a distributer distributing components 20 from the bulk storage on the pick surface 10. The pick surface 10 is surrounded by a flexible retaining wall 40 preventing the components 20 from escaping the pick surface 10. The flexible retaining wall 40 is made of neoprene. It has a height 70 of 30 mm and a thickness 80 of 2 mm, and it is vertical.

The operation of the component feeder 100 is explained with reference to FIGS. 4a-4i. At starting position according to FIG. 4a, both the lift 120 and the pusher plate 140 assume fully extracted positions. Components 20 are introduced from above through a filling aperture at the top of the hopper 110. Upon receiving a command from a robot which the component feeder 100 is intended to serve, the sequence of actions is as follows: At step one according to FIG. 4b the lift 120 is drawn down to its lowermost position and simultaneously the pusher plate 140 is withdrawn to its rearmost position flush with the rear wall of the hopper 110. At step two according to FIG. 4c the lift 120 moves back to the top, bringing with it a first selection of components 20 which settle on the lift platform 130. At step three according to FIG. 4d a lift adjuster in the form of the pusher plate 140 advances slowly to a predetermined position partway along its stroke, thereby reducing the lift platform 130 area and pushing some components 20 back to the bulk storage such that a second selection of components 20 remains on the lift platform 130. At step four according to FIG. 4e the pusher plate 140 retreats once more to its rearward end position.

Figure 4G:
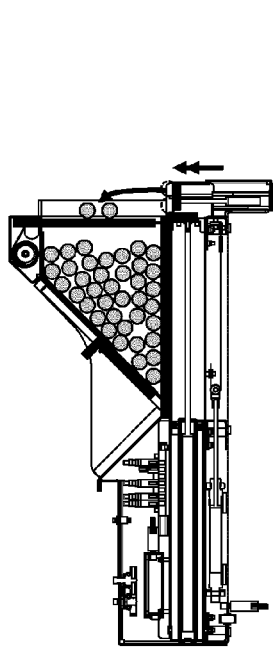
Figure 4H:
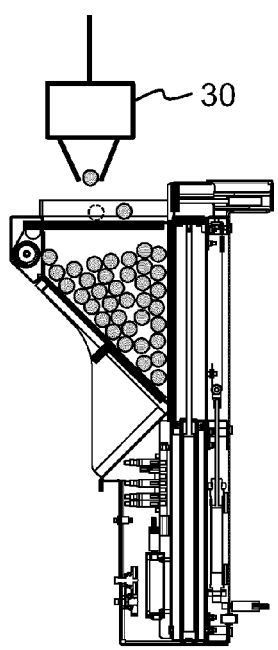
Figure 4I:
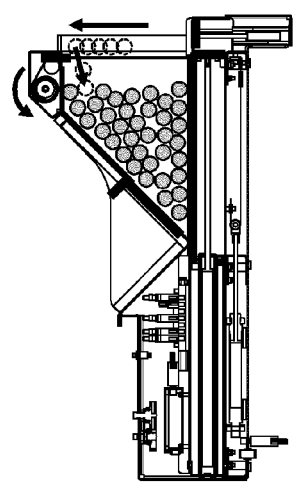

At step five according to FIG. 4f the pick surface 10 unfurls and covers completely the filling aperture. At step six according to FIG. 4g the pusher plate 140 gives the selection of components 20 a push to thereby spread the components 20 out on the pick surface 10. Once the selection of components 20 is at rest on the pick surface 10, at step seven according to FIG. 4h a robot gripper 30 picks up the components 20. At step eight according to FIG. 4i the pick surface 10 is coiled back around its capstan. Any parts eventually remaining on the pick surface 10 after step seven fall back to the bulk storage once the pick surface 10 is fully withdrawn. After step eight the state of the component feeder 100 corresponds to the starting position and the cycle may be repeated starting from step one.

The component feeder 100 described hereinbefore cooperates with an industrial robot to thereby constitute a component feeding system. The industrial robot comprises a robot gripper 30 for picking the components 20 from the pick surface 10.

The invention is not limited to the embodiments shown above, but the person skilled in the art may modify them in a plurality of ways within the scope of the invention as defined by the claims.

The invention claimed is:

1. A component feeder comprising:
   a distributer configured to distribute components from a bulk storage on a pick surface; and
   a retaining wall configured to prevent the components from escaping the pick surface, the retaining wall being vertical, the retaining wall having a height and a stiffness less than 100 N/mm in a direction of the height, and the retaining wall being flexible such that the retaining wall deforms when a force is applied on the retaining wall, and such that the retaining wall assumes an original shape when the force is no longer applied on the retaining wall.

2. The component feeder of claim 1, wherein the retaining wall comprises a material having a Young's modulus value less than 50 MPa.

3. The component feeder of claim 1, wherein the retaining wall material comprises neoprene.

4. The component feeder of claim 1, wherein the height is at least five times a thickness of the retaining wall.

5. The component feeder of claim 1, wherein the retaining wall comprises a material having a Young's modulus value less than 20 MPa.

6. The component feeder of claim 1, wherein the retaining wall comprises a material having a Young's modulus value less than 10 MPa.

7. The component feeder of claim 1, wherein the retaining wall comprises a material having a Young's modulus value less than 5 MPa.

8. The component feeder of claim 1, wherein the retaining wall comprises a material having a Young's modulus value less than 2 MPa.

9. The component feeder of claim 1, wherein the retaining wall comprises a material having a Young's modulus value less than 1 MPa.

10. The component feeder of claim 1, wherein the stiffness is less than 10 N/mm.

11. The component feeder of claim 1, wherein the stiffness is less than 5 N/mm.

12. The component feeder of claim 1, wherein the stiffness is less than 2 N/mm.

13. The component feeder of claim 1, wherein the stiffness is less than 1 N/mm.

14. The component feeder of claim 1, wherein the height is at least ten times a thickness of the retaining wall.

15. The component feeder of claim 1, wherein the height is at least twenty times a thickness of the retaining wall.

16. The component feeder of claim 1, wherein the height is at least thirty times a thickness of the retaining wall.

17. A component feeding system comprising:
   a component feeder comprising:
      a distributer configured to distribute components from a bulk storage on a pick surface; and
      a retaining wall configured to prevent the components from escaping the pick surface, the retaining wall being vertical, the retaining wall having a height and a stiffness less than 100 N/mm in a direction of the height, and the retaining wall being flexible such that the retaining wall deforms when a force is applied on the retaining wall, and such that the retaining wall assumes an original shape when the force is no longer applied on the retaining wall; and
   an industrial robot comprising a robot gripper, the industrial robot configured to pick the components from the pick surface.

18. The component feeding system of claim 17, wherein the robot gripper is moveable in a vertical direction between a first position and a second position;
   wherein the robot gripper is positionable relative to the retaining wall such that the robot gripper will collide with the retaining wall during movement from the first position to the second position.

19. The component feeding system of claim 18, wherein the retaining wall is configured to deform when the robot gripper collides with the retaining wall during movement from the first position to the second position.

20. The component feeding system of claim 19, wherein the retaining wall is configured to assume the original shape after the robot gripper is moved from the second position back to the first position.

* * * * *